(12) United States Patent
Wang

(10) Patent No.: US 6,907,659 B2
(45) Date of Patent: Jun. 21, 2005

(54) METHOD FOR MANUFACTURING AND PACKAGING INTEGRATED CIRCUIT

(75) Inventor: Ching-Shun Wang, Taipei Hsien (TW)

(73) Assignee: Advanced Connection Technology Inc., Taipei Hsien (TW)

( * ) Notice: Subject to any disclaimer, the term of this patent is extended or adjusted under 35 U.S.C. 154(b) by 192 days.

(21) Appl. No.: 10/358,196

(22) Filed: Feb. 5, 2003

(65) Prior Publication Data

US 2004/0148774 A1 Aug. 5, 2004

(51) Int. Cl.$^7$ .............................................. H01R 43/00
(52) U.S. Cl. ............................ 29/883; 29/827; 29/841; 29/842; 29/845; 29/874; 29/884; 174/52.4; 257/676; 257/696
(58) Field of Search ........................ 29/883, 827, 841, 29/842, 845, 874, 884; 174/52.4; 257/676, 696

(56) References Cited

U.S. PATENT DOCUMENTS

| | | | | |
|---|---|---|---|---|
| 4,195,193 A | * | 3/1980 | Grabbe et al. ............. | 174/52.4 |
| 4,330,683 A | * | 5/1982 | Parker ....................... | 174/52.4 |
| 5,152,057 A | * | 10/1992 | Murphy ....................... | 29/883 |
| 5,819,403 A | * | 10/1998 | Crane et al. ................. | 29/841 |

* cited by examiner

Primary Examiner—Carl J. Arbes
Assistant Examiner—Tim Phan
(74) Attorney, Agent, or Firm—Birch, Stewart, Kolasch & Birch, LLP

(57) ABSTRACT

A method for manufacturing and packaging an integrated circuit includes following steps: pressure a continuous pin material and a base board area at first; then cut off pin material into several pin units, accommodate each pin units into respective position in a mould, and ejecting plastic into the mould gap to shape a pin unit, then remove waste part of the pin material after removing down the mould parts; put four pin units and a base board into a rectangle mould, then eject plastic again into mould gap, after that cut off waste part of the base board to attain an IC socket; stick an IC chip on top of the base board of the IC socket and wire it. Finally, cover and stick a panel on the IC socket to finish the whole IC packaging procedures.

2 Claims, 4 Drawing Sheets

METHOD FOR MANUFACTURING AND PACKAGING INTEGRATED CIRCUIT

BACKGROUND OF THE INVENTION

1. Field of the Invention

The present invention relates to a method for manufacturing and packaging an integrated circuit, especially refer to the manufacturing and packaging procedure of IC (integrated circuit) socket of an integrated circuit, mainly pressure a string of pin unit for the four square edges by molding pin material, then put four pin units and a base board to mould an IC socket, and stick IC chip in the base board of the IC socket and coat IC chip and pins. Finally, cover and stick a panel to finish the IC product packaging procedures so as to curtail manufacturing hours and decrease defective rate of IC sockets.

2. Description of the Prior Art

Nowadays, techniques of packaging procedure of the Integrated Circuit for electronic appliance categorize into two following methods:

First, refer to FIG. 3. the pin material (a) is etched or is casted into multiple pins (a1) lined up in rectangle type, then press the continuous metal area at central IC laminate (a2) into the shape as shown in FIG. B, then put the pin material (a) on a mould (f) opposite to it for casting plastic material (g) into the mould gap, till the plastic become solid, cut off the useless metal and remain an IC base (c); and then turn the IC base (c) upside down for cohesion of IC chip (b) on the surface of central IC laminate (a2) of IC base (c), after that wiring the surround connection points of IC chip (b) with pins by metal reel (gold or silver reel), then put an adhesive panel (glass or plastic) (e) on top of the IC base (c) to finish the packaging procedure.

The defectives of conventional manufacturing procedure are as follows: the terminal pins (a1)(must be highly conductive) and IC laminate (a2) (must be highly thermal conductive) has to be built in same material, whereas material with highly conductive and thermal conductive incurs extreme high cost, and the terminal pin (a1) is very slim so that it is hard to be fixed and high pressure plastic packaging with fast injection molding manufacturing procedure; furthermore, when terminal pin (a1) in such conventional manufacturing procedure needs galvanization, the process is to electroplate the whole pin material (a) which cause more electroplating material spending, and the terminal pin (a1) electroplated in this way could be adhered only on the bottom that cause less conductive and adhesive effect. Therefore, products manufactured by such conventional method will decrease market competitiveness.

As to FIG. 4, the component is composed of two PC Boards (h) and (i), the lower layer PC board (h) is made by etching electronic pins (h1) required and base board (h2) in conventional way, then processing upper layer PC board (i) into frame-like structure, then glued both components (h) and (i) into IC base (c) which exposes electronic pins (h1) out from inner side of rectangle frame (j), furthermore, on the central board (h2) of lower electronic PC Board adhesive IC chip, after that wiring metal reel (d) with the surround connection points of IC chip (b), then adhesive a glass or plastic panel (e) on upper PC Board (i) of the IC base (c) to finish the packaging procedure.

The defectives of conventional manufacturing procedure are as follows: during the processing period, both PC Boards are apt to yield zigzag edge which will cause extreme high defective rate at the following step of IC wiring procedure.

Based on the above mentioned conventional IC chip packaging do have its own disadvantages respectively, there is a need to develop a new packaging skill and design a newly manufacturing procedure.

BRIEF DESCRIPTION OF THE DRAWINGS

The accomplishment of the above-mentioned object of the present invention will become apparent from the following description and its accompanying drawings which disclose illustrative an embodiment of the present invention, and are as follows.

SUMMARY OF THE INVENTION

It is therefore a primary object of the present invention to provide a method for manufacturing and packaging an integrated circuit that is built by putting a continuous pins in a mould before ejecting plastic to form a pin unit, then fix four pin units into another mould and ejecting plastic to form an IC socket. Therefore save the manufacturing hours, raise manufacturing efficiency, and reduce manufacturing cost.

The main manufacturing procedures are as follows: pressure a continuous pin and base board at first, cut off pin material into several pin units with pin number required, then accommodate each pin units into respective position in the mould, and ejecting plastic into mould gap to shape an pin unit, and cutting off waste part of pin material after tearing down the mould parts; Put four pin units and one base board into the four edge and center of a rectangle mould, then eject plastic again into mould gap, after that cut off waste of base board to attain an IC socket, and stick IC chip on the top of base board of the IC socket and coat IC chip and pins. Finally, cover and stick a panel on the IC socket to finish the whole IC product packaging procedures.

DETAILED DESCRIPTION OF THE PREFERRED EMBODIMENT

Figure 1:
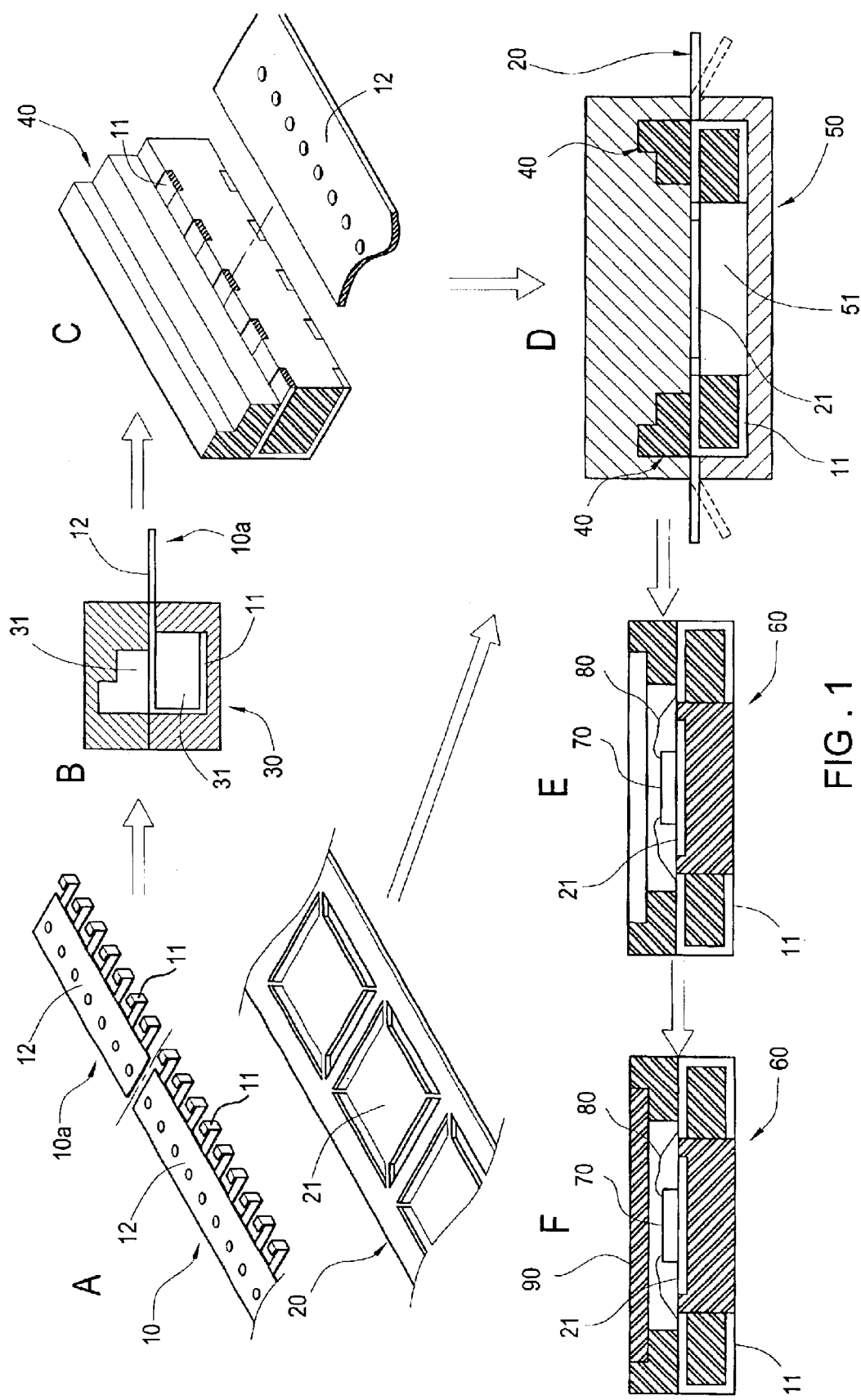
FIG. 1 is a schematic drawing of the flowchart in accordance with the present invention.
Figure 2:
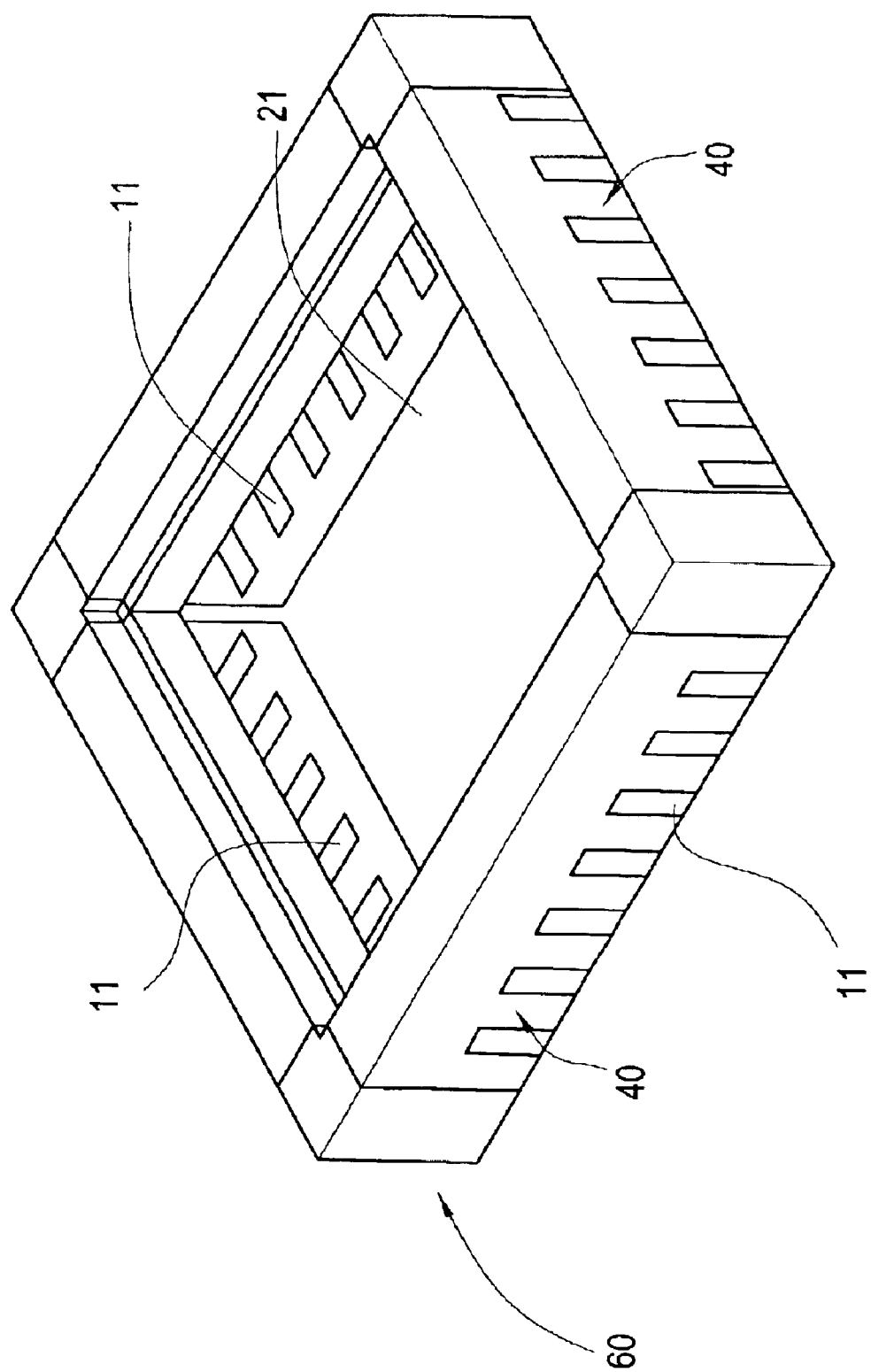
FIG. 2 is a schematic drawing of an IC socket of the present invention.
Figure 3:
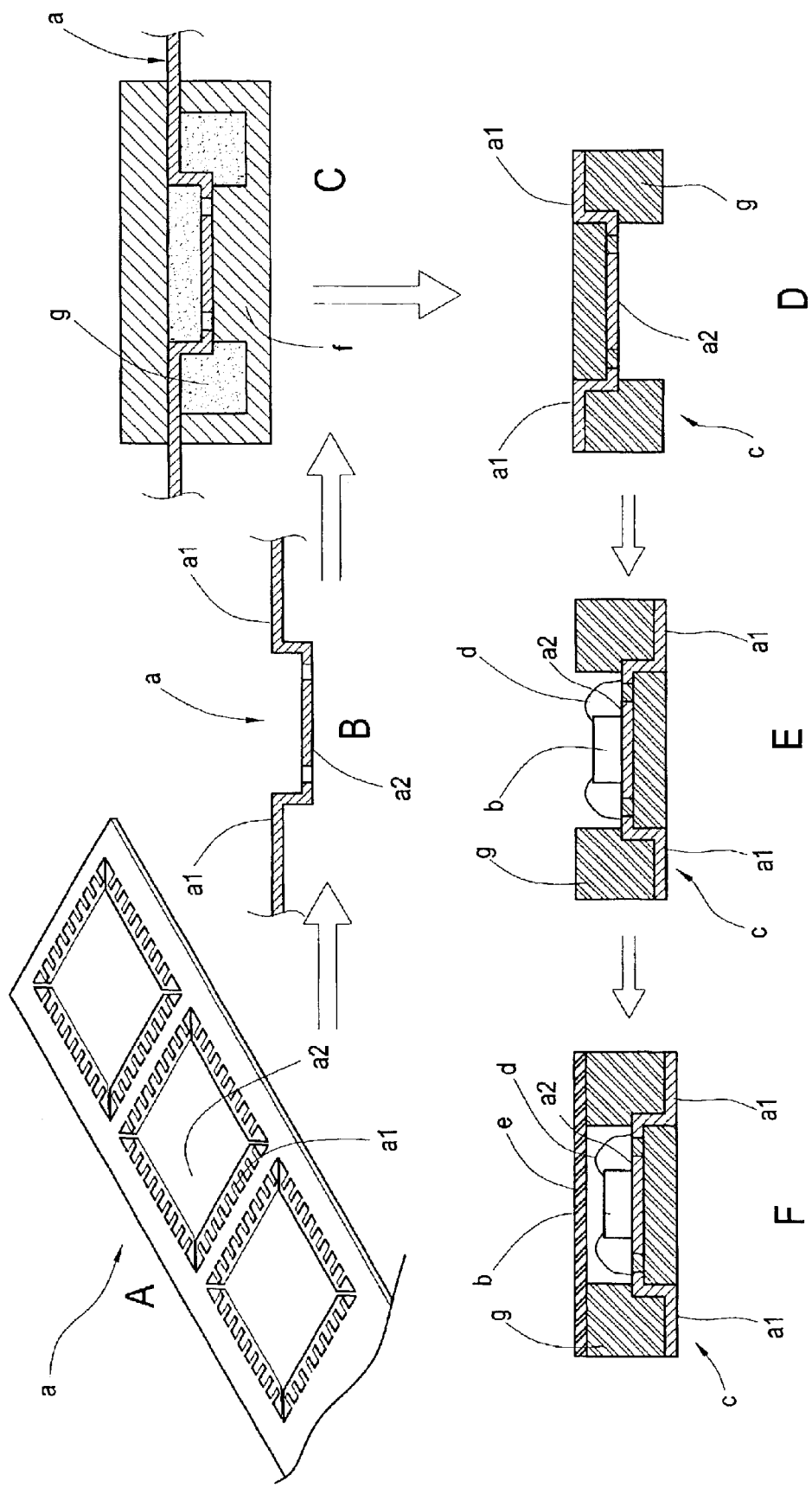
FIG. 3 is a flowchart of a prior art.
Figure 4:
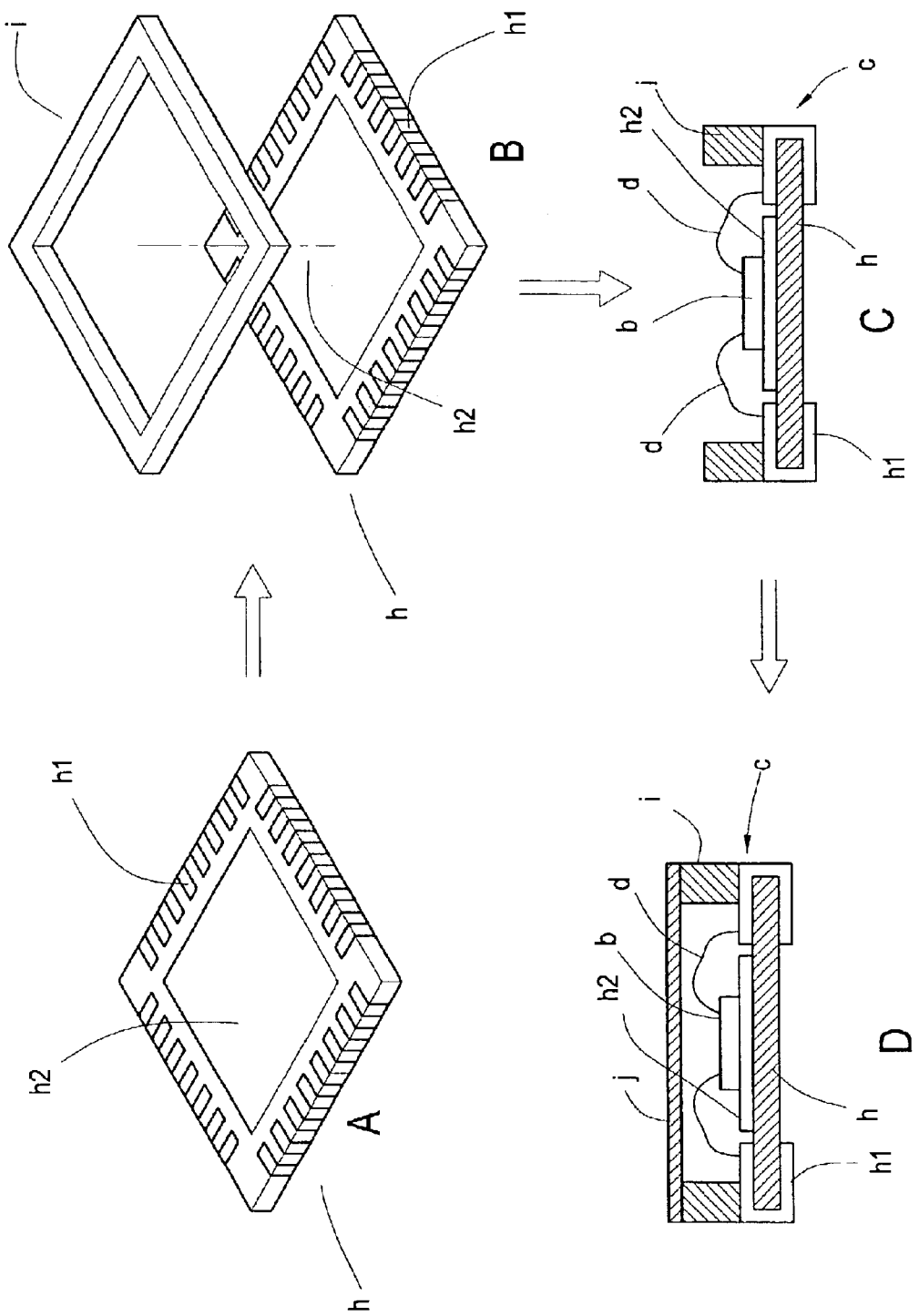
FIG. 4 is a flowchart of an IC board made by lamination of a prior art.

At first, please refer to FIG. 1 and FIG. 2, a method for manufacturing and packaging an integrated circuit includes following procedures:

(a) Pressure a continuous pin material area 10 and a base board area 20, on the pin material area 10 lined up several pins 11 (as for this example, the pins look like "L" type perpendicular to pin material area); whereas at the center of the base board area 20 possesses a plurality of base board 21;

(b) Cut off pin material area 10 into a plurality of pin units 10a (each IC is composed of four pin units) with pin 11 number (length) required, then accommodate each pin units into respective position in the mould 30;

(c) then eject plastic to fill mould gap 31 of the mould 30 into one pin unit 40, and then cut off waste part 12 of pin material area 10 after tearing down the mould parts;

(d) Put four pin units 40 and one base board area 20 mentioned above into the four edge and center of a rectangle mould 50 respectively, then eject plastic again into mould gap 51, while cut off waste of the base boards 21 to attain an IC socket 60 (as shown in FIG.

2) after plastic become solid and the mould components being moved down;

(e) Stick an IC chip 70 on the top of center base board 21 of the IC socket 60, and wire the connection point surrounding IC chip 70 and each of U type pins 11 with a metal reel 80 to join the two components;

(f) finally, cover and stick a panel 90 on top of the wired IC socket 60 to finish the whole IC packaging procedures.

According to the above mentioned manufacturing procedure: pins 11 are cut off from pin material area 10 into several pin units 10*a* that were accommodated into respective position in the mould gap 31 of mould 30 together with the waste part 12, and hold fixed by upper and lower mould clip; hence each pin 11 posses excellent position effect so that it could be built into an pin units 40 fast and massively by high pressure and high speed ejecting machines, and reduce the defective works; then put four pin units 40 lined up into rectangle shape in another mould 50, then eject plastic again into mould gap 51 to attain an IC socket 60. Thus the defectives of conventional shape casting method such as time consuming in casting, high defective quality rate, only bottom surface of IC pin a1 made by conventional method is conductive are improved. In addition, the manufacturing method of the invention uses fast processing machinery, the outlook of mould could be changed to fit the requirement of assembly by alternating the designation of mould, therefore the method of the invention is more convenient, faster than conventional packaging procedure, and also improves the IC wiring defective caused by zigzag edge of the IC board to meet the industry requirement.

Furthermore, in the manufacturing procedure of the invention, the pin material area 10 and the based board area 20 are built into two different individual parts. When pin 11 needs electroplate processing, another component could be avoid to be electroplated (for example: baseboard, waste part of pin material area, etc), therefore easily save expensive metal usage and electroplating time, further to attain the purpose of reducing manufacturing cost.

It should be noted that the above description and accompanying drawings are only used to illustrate some embodiments of the present invention, not intended to limit the scope thereof. Any modification of the embodiments should fall within the scope of the present invention.

What is claimed is:

1. A method for manufacturing and packaging an integrated circuit comprising the steps of:

pressuring a continuous pin material area and a base board area, a plurality of pins being arranged linearly on said pin material area, said base board area including a plurality of base boards at a central portion of said base board area;

cutting off said pin material area into a plurality of first pin units based on a required number of pins;

accommodating each of said plurality of first pin units into a corresponding mould;

injecting a plastic to fill a gap of said corresponding mould thereby forming a plurality of second pin units;

cutting off a waste part of said pin material area after removing said mould;

placing four of said plurality of second pin units on four sides of a rectangular mould and placing one of said plurality of boards at a central portion of a rectangle mould;

injecting the plastic into a gap of said rectangle mould;

cutting off a waste of said one base after removing said rectangle mould, thereby obtaining an integrated circuit socket;

placing an integrated circuit chip at a central portion of said one base board;

connecting a plurality of connection points of said grated circuit chip to said pins on said four second pin units, respectively; and covering a panel at a top of said integrated circuit socket.

2. A method for manufacturing an integrated circuit socket comprising the steps of:

pressuring a continuous pin material area and a base board area, a plurality of pins being arranged linearly on said pin material area, said base board area including a plurality of base boards at a central portion of said base board area;

cutting off said pin material area into a plurality of first pin units based on a required number of pins;

accommodating each of said plurality of first pin units into a corresponding mould;

injecting a plastic to fill a gap of said corresponding mould, thereby forming a plurality of second pin unit;

cutting off a waste part of said pin material area after removing said mould;

placing four of said plurality of second pin units on four sides of a rectangular mould and placing one of said plurality of boards at a central portion of a rectangle mould;

injecting the plastic into a gap of said rectangle mould; and cutting off a waste of said one base after removing said rectangle mould, thereby obtaining said integrated circuit socket.

* * * * *